(12) United States Patent
Deguchi

(10) Patent No.: US 6,727,714 B2
(45) Date of Patent: Apr. 27, 2004

(54) PROBE CARD

(75) Inventor: Yoshinori Deguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/225,193

(22) Filed: Aug. 22, 2002

(65) Prior Publication Data

US 2003/0057976 A1 Mar. 27, 2003

(30) Foreign Application Priority Data

Sep. 27, 2001 (JP) ........................................ 2001-297633

(51) Int. Cl.7 ................................................ G01R 31/02
(52) U.S. Cl. ....................................... 324/754; 324/757
(58) Field of Search .............................. 324/754, 761, 324/758, 757, 756, 158.1, 762

(56) References Cited

U.S. PATENT DOCUMENTS

| | | | |
|---|---|---|---|
| 5,534,784 A | * 7/1996 | Lum et al. | 324/757 |
| 5,828,226 A | * 10/1998 | Higgins et al. | 324/762 |
| 6,456,099 B1 | * 9/2002 | Eldridge et al. | 324/754 |
| 6,483,328 B1 | * 11/2002 | Eldridge et al. | 324/754 |

FOREIGN PATENT DOCUMENTS

| | | |
|---|---|---|
| JP | 5-136224 | 6/1993 |
| JP | 7-301642 | 11/1995 |

* cited by examiner

*Primary Examiner*—David A. Zarneke
*Assistant Examiner*—Tung X. Nguyen
(74) *Attorney, Agent, or Firm*—McDermott, Will & Emery

(57) ABSTRACT

A probe card has an offset substrate electrically connected between a probe card substrate and an interposer substrate with solders. It is possible to secure the thickness of the interposer substrate plus the thickness of the offset substrate for the depth of the positioning holes of the probe needles, which results in the improved positioning accuracy of the probe needle.

3 Claims, 3 Drawing Sheets

PROBE CARD

BACKGROUND OF THE INVENTION

1. Field of the Invention

The present invention relates to a probe card for a wafer test (inspection jig for a wafer test) of a semiconductor device.

2. Description of the Related Art

FIG. 4 is a configurational view showing the outline of a probe part when a wafer test is conducted in the related art. In FIG. 4, reference numeral 1 denotes a wafer stage for supporting a wafer 2 to be measured; 3 denotes a test head; 4 denotes a performance board; 5 denotes a POGO pin ring; 6 denotes a probe card substrate; 7 denotes a probe needle; and the probe card substrate 6 and the probe needle 7 constitute a probe card 8.

A semiconductor device undergoes a wafer test by the configuration shown in FIG. 4 at the step of a wafer. At this time, the probe needle 7 of the probe card 8 flaws the pad of the wafer 2 to be measured to establish an electric contact, thereby inspecting the function of the semiconductor device with a tester.

FIG. 5 is a configurational view showing a vertical type probe card in the related art. In FIG. 5, reference numeral 6 denotes a probe card substrate; 7 denotes a probe needle; 9 denotes a space transformer; and 10 denotes a wiring.

In this vertical type probe card, the probe card substrate 6 is connected to the probe needle 7 via the space transformer 9 through the wiring 10 made of a Nichrome wire, a coaxial cable or the like and the wiring 10 is connected with solder.

In this case, there are presented the following problems: that is, the soldering of the wiring 10 becomes difficult and the manufacturing time increases with the increasing packing density of the semiconductor device and the increasing density of the probe needles 7 caused by the increasing of the number of pads; and the increasing density of the wirings 10 reduces the waveform transmitting performance between the probe card substrate 6 and the probe needle 7 and makes it impossible to respond to the speed-up of the semiconductor device (the increasing of an operating frequency).

In order to solve such problems, in particular, in order to respond to the speed-up of the semiconductor device, there is proposed a probe card having a structure shown in FIG. 6.

FIG. 6 is a configurational view showing a probe card employing an interposer substrate in the related art. In FIG. 6, reference numeral 11 denotes a probe card substrate; 12 denotes an interposer substrate soldered to the bottom surface of the probe card substrate 11; 13 denotes probe needles formed in such a way as to be put into electric contact with the bottom surface of the interposer substrate 12; 14a to 14d denote stiffeners for supporting the probe card substrate 11; 15a and 15b denote the positioning holes of the probe needles 13 made in the stiffeners 14b and 14d; 16a and 16b denote positioning pins inserted into the positioning holes 15a and 15b to fix the probe needles 13.

In FIG. 6, the interposer substrate 12 is soldered to the bottom surface of the probe card substrate 11 and the probe needles 13 are formed such that they are put into electric contact with the bottom surface of the interposer substrate 12. The probe needles 13 are positioned and fixed to the interposer substrate 12 by arranging the probe needles 13 from the bottom surface side of the interposer substrate 12 and by inserting the positioning pins 16a and 16b into the positioning holes 15a and 15b made in the stiffeners 14a and 14d.

Since the probe card in the related art is constituted in the foregoing manner, in the probe card shown in FIG. 6, the interposer substrate 12 itself is apt to be reduced in thickness because the interposer substrate 12 is easily formed.

However, if the interposer substrate 12 becomes thinner, also the positioning holes 15a and 15b formed in the stiffeners 14b and 14d need to be made shallow, thereby insufficiently fixing the probe needles 13 to the interposer substrate 12 by the positioning pins 16a and 16b, which results in decreasing the accuracy of positioning the probe needles 13. In particular, if the thickness of the interposer substrate 12 becomes smaller than 1.2 mm, there is presented a problem that the accuracy of positioning decreases markedly.

Further, if the interposer substrate 12 becomes thinner, when the probe needles 13 press the wafer 2 to be measured, the interposer substrate 12 is warped by the pressure applied to the interposer substrate 12 by probe needles 13, which presents a problem that this warping of the substrate 12 causes instability in the contact near the solder between the interposer substrate 12 and the probe card substrate 11 and flaws and breaks the interposer substrate 12.

Incidentally, in the configuration of the interposer substrate 12, in the case where a terminal pitch in the terminal layout of the probe card substrate 11 side is wider than a terminal pitch in the terminal layout of the probe needle 13 side, for example, the terminal pitch in the terminal layout of the probe card substrate 11 side is 0.8 mm and the terminal pitch in the terminal layout of the probe needle 13 side ranges from 0.1 mm to 0.2 mm, when the probe needles 13 press the wafer 2 to be measured, the probe needles 13 of from 9 to 16 pins are pushed up at least a region of 0.8 mm×0.8 mm of the interposer substrate 12, so that a load as large as about from 1 to 2 kg is applied to the region of 0.8 mm×0.8 mm of the interposer substrate 12.

SUMMARY OF THE INVENTION

The present invention has been made to solve the aforementioned problem and the object of the present invention is to provide a probe card capable of improving the positioning accuracy of the probe needles and preventing the warping of the interposer substrate.

According to an aspect of the present invention, there is provided a probe card having an offset substrate electrically connected between a probe card substrate and an interposer substrate.

Thus, it is possible to secure the thickness of the interposer substrate plus the thickness of the offset substrate for the depths of the positioning hole of the probe needle positioning member, which results in the improved positioning accuracy of the probe needle.

In addition, it is possible to provide the offset substrate with the bypass capacitor.

Here, resin may be fully stuffed between an offset substrate and the interposer substrate.

Thus, it is possible to prevent the electric connection between the offset substrate and the interposer substrate from being made unstable, and the fully stuffed resin integrates the offset substrate with the interposer substrate to increase thickness to thereby prevent the interposer substrate from being warped and flawed or broken.

DETAILED DESCRIPTION OF THE PREFERRED EMBODIMENTS

An embodiment of the present invention will be described below.

Embodiment 1

Figure 1:
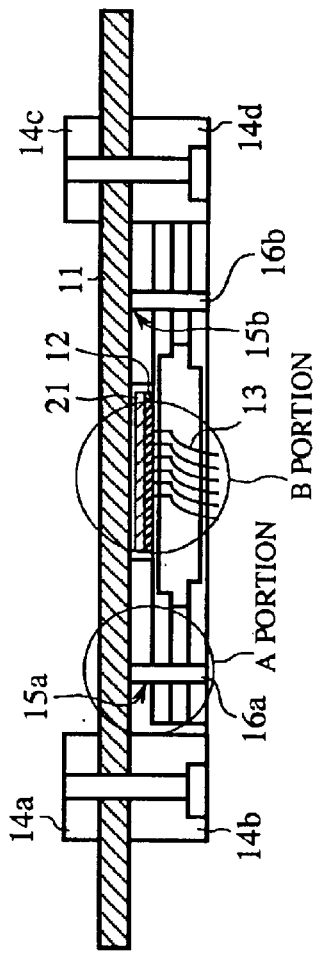
FIG. 1 is a configurational view showing a probe card using an interposer substrate in accordance with an embodiment 1 of the present invention.
Figure 2:
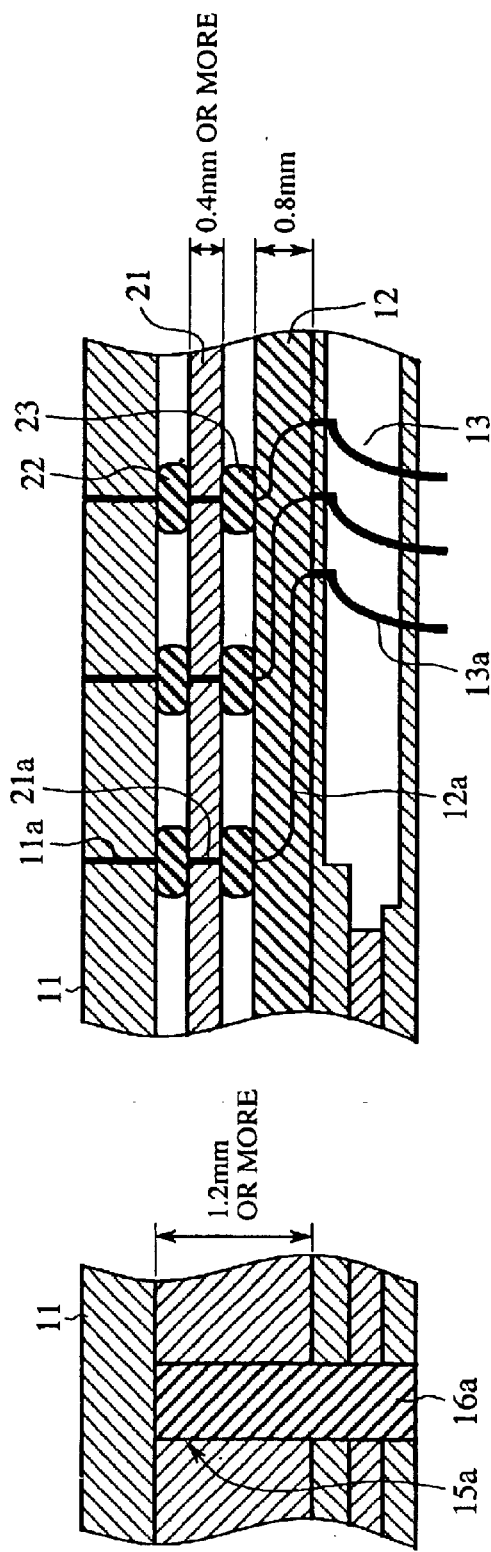
FIG. 2 is a configurational view showing A portion and B portion of the probe card in detail.

FIG. 1 is a configurational view to show a probe card using an interposer substrate in accordance with the embodiment 1 of the present invention, and FIG. 2 is a configurational view showing A portion and B portion of the probe card in detail. In the drawings, reference numeral 11 denotes a probe substrate; a reference numeral 11a denotes a through hole wiring; 21 denotes an offset substrate soldered to the through hole wiring 11a on the bottom surface of the probe card substrate 11; 21a denotes a through hole wiring thereof; 22 denotes solder; 12 denotes an interposer substrate soldered to the through hole wiring 21a on the bottom surface of the offset substrate 21; 12a denotes a conductive wiring thereof; 23 denotes solder thereof; 13 denotes a probe needle formed in such a way as to be brought into electric contact with the bottom surface of the interposer substrate 12; 13a denotes a pin thereof; 14a to 14d denote stiffeners for supporting the probe card substrate 11 (probe positioning member); 15a and 15b denote positioning holes for positioning the probe needles 13 (probe positioning member) which are made in the stiffeners 14b and 14d; and 16a and 16b denote positioning pins (probe positioning member) inserted into the positioning holes 15a and 15b to fix the probe needles 13.

Next, the operation of the probe card will be described.

In the embodiment 1, the offset substrate 21 to be formed at an arbitrary thickness is interposed between the probe card substrate 11 and the interposer substrate 12 required to be thin. Incidentally, the probe card substrate 11 is electrically connected to the offset substrate 21 with the solder 22 and the offset substrate 21 is electrically connected to the interposer substrate 12 with the solder 23.

The offset substrate 21 is provided to secure the depth of the positioning holes 15a and 15b for the probe needles 13 made in the stiffeners 14b and 14d. In order to secure sufficient positioning accuracy of the probe needles 13, for example, a depth of not smaller than 1.2 mm is required. Therefore, by forming the offset substrate 21 at an arbitrary thickness, the depth of the positioning holes 15a and 15b can be made not smaller than 1.2 mm.

For example, in FIG. 2, in the case where the interposer substrate 12 is 0.8 mm thick, in order to make the depth of the positioning holes 15a and 15b not smaller than 1.2 mm, it is apparent that the offset substrate 21 need to have a thickness not smaller than 0.4 mm.

As described above, according to the present embodiment 1, it is possible to secure the thickness of the interposer substrate 12 plus the thickness of the offset substrate 21 to be formed at an arbitrary thickness for the depths of the positioning holes 15a and 15b and thus to improve the positioning accuracy of the probe needle 13.

Further, the offset substrate 21 is formed in the same outside size as the interposer substrate 12 and is provided with the through hole wirings 21a in the same arrangement as the terminal arrangement on the top surface of the interposer substrate 12, and thus can be realized by the simple configuration.

Still further, it is preferable to make a region where a capacitor is to be mounted on the offset substrate 21 and to mount a bypass capacitor thereon, or to form the offset substrate 21 of a highly dielectric material and to make it serve as the bypass capacitor.

Embodiment 2

Figure 3:
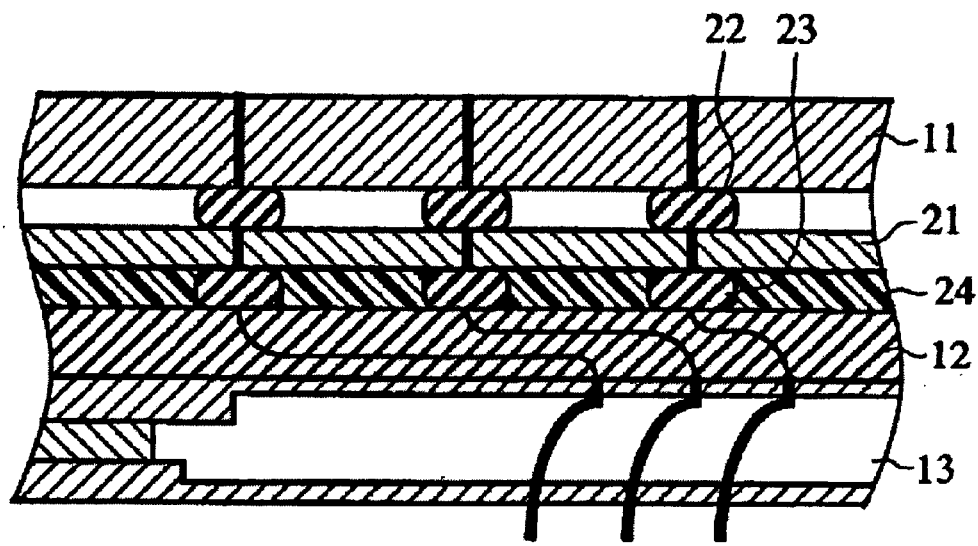
FIG. 3 is a configurational view to show a probe card using an interposer substrate in accordance with an embodiment 2 of the present invention.
Figure 4:
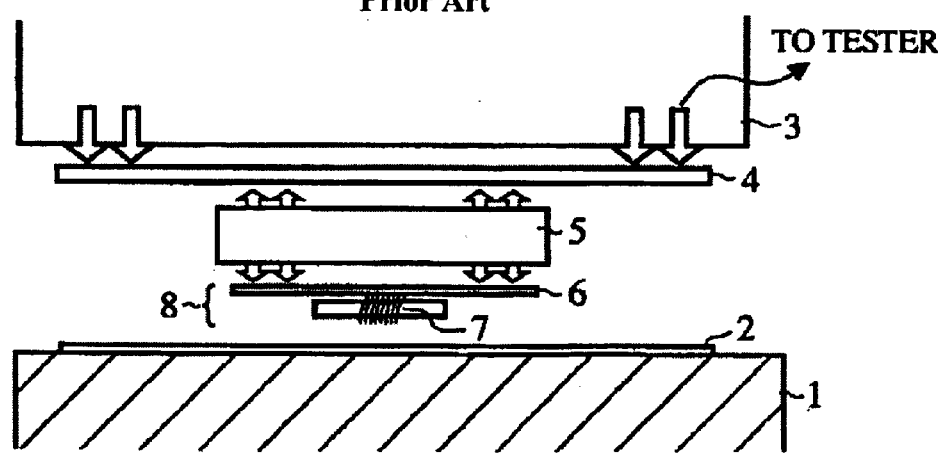
FIG. 4 is a configurational view to schematically show the a probe portion when a wafer test is performed in the related art.
Figure 5:
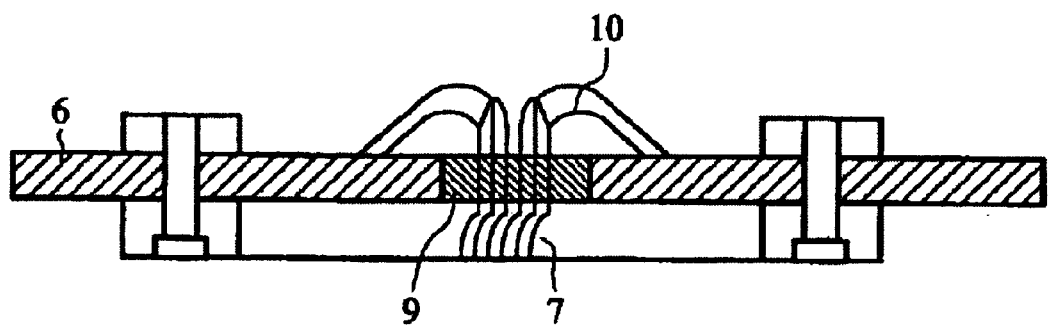
FIG. 5 is a configurational view to show a vertical probe card in the related art.
Figure 6:
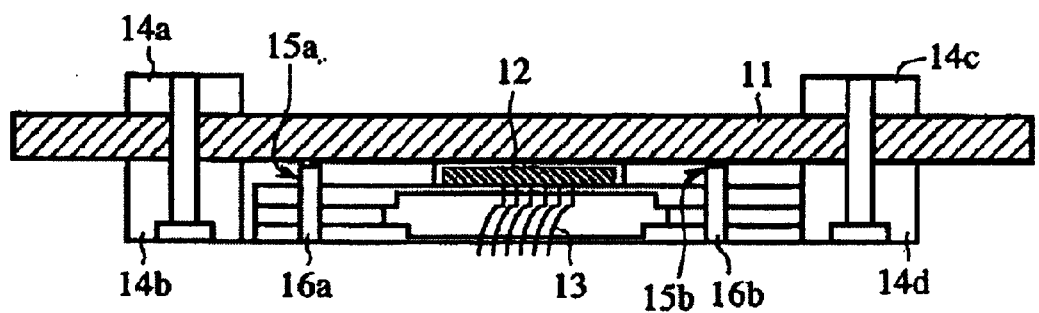
FIG. 6 is a configurational view to show a probe card using an interposer substrate in the related art.

FIG. 3 is a configurational view showing a probe card using an interposer substrate in accordance with an embodiment 2 of the present invention. In FIG. 3, reference numeral 24 denotes resin such as an epoxy resin fully stuffed between an offset substrate 21 and an interposer substrate 12. The other configuration is the same as the embodiment 1.

Next, the operation of the probe card will be described.

In the embodiment 2, the offset substrate 21 is bonded to the interposer substrate 12 with solder 23 and resin 24 is fully stuffed between the offset substrate 21 and the interposer substrate 12.

As described above, according to the present embodiment 2, as in the case of the embodiment 1, it is possible to improve the positioning accuracy of the probe needle 13.

Further, the resin 24 fully stuffed between the offset substrate 21 and the interposer substrate 12 can prevent the electric connection between the offset substrate 21 and the interposer substrate 12 from being made unstable by the separation of the solder 23 or the like, and can integrate the offset substrate 21 with the interposer substrate 12 to increase thickness to thereby prevent the interposer substrate 12 from being warped and flawed or broken.

What is claimed is:

1. A probe card comprising:

a probe card substrate;

an offset substrate electrically connected to the probe card substrate;

an interposer substrate electrically connected to the offset substrate;

a probe needle formed so that it is electrical contact with the interposer substrate; and a probe needle positioning member for positioning and fixing the probe needle so that the probe needle is in electric contact with the interposer substrate, said probe needle positioning member comprising:

a stiffener for supporting the probe card substrate, said stiffener having a recess to receive said offset substrate and interposer substrate, and positioning holes provided around the recess for positioning the probe needle: and positioning pins each inserted into the respective positioning holes to secure the probe needle, wherein the depth of said positioning member is not smaller than the total thickness of the offset substrate and interposer substrate.

2. The probe card according to claim 1, wherein resin is stuffed between the offset substrate and the interposer substrate.

3. The probe card according to claim 1, wherein the total thickness of the offset substrate and interposer substrate is 1.2 mm or more.

* * * * *